United States Patent [19]

Aoki

[11] Patent Number: 4,654,602
[45] Date of Patent: Mar. 31, 1987

[54] CURRENT MIRROR CIRCUIT

[75] Inventor: Hidehiko Aoki, Yokohama, Japan

[73] Assignee: Kabushiki Kaisha Toshiba, Kawasaki, Japan

[21] Appl. No.: 813,072

[22] Filed: Dec. 24, 1985

[30] Foreign Application Priority Data

Dec. 25, 1984 [JP] Japan .................. 59-278402

[51] Int. Cl.$^4$ ............................................. H03F 3/45
[52] U.S. Cl. .................................... 330/257; 330/288; 323/315
[58] Field of Search .............. 330/257, 288; 323/315, 323/316

[56] References Cited

U.S. PATENT DOCUMENTS 4,092,611  5/1978  Frederiksen et al. ........... 330/257 X

FOREIGN PATENT DOCUMENTS 51-1383    1/1976  Japan .
51-147235 12/1976  Japan .

Primary Examiner—James B. Mullins
Attorney, Agent, or Firm—Oblon, Fisher, Spivak, McClelland & Maier

[57] ABSTRACT

A current mirror circuit suitable for a wide range input current and low voltage integrated circuit. The current mirror circuit comprises; a power supply source, a circuit ground, a reference voltage source; first and second transistors of a first conductivity type, which have their collectors, their bases connected together and their emitters connected to the power supply source, an input current supplying transistor connected in series to the collector-emitter path of the first transistor, an output current deriving circuit connected in series to the collector-emitter path of the second transistor, a third transistor of a second conductivity type complementary to the first conductivity type, which has its collector connected to the power supply source, its base connected to the collector of the first transistor and its emitter, a fourth transistor of the second conductivity type, which has its collector connected to the bases of the first and second transistors, its base connected to the reference voltage source and its emitter connected to the emitter of the third transistor, and a current source transistor connected between the emitter of the third and fourth transistors and the circuit ground, which is connected to the input current supplying transistor so as to be controlled by the input current supplying transistor.

5 Claims, 5 Drawing Figures

CURRENT MIRROR CIRCUIT

BACKGROUND OF THE INVENTION

1. Field of the Invention

This invention relates to a current mirror circuit and, more particularly, to a current mirror circuit suitable for a wide range input current and low voltage integrated circuit.

2. Description of the Prior Art

Current mirror circuits are well known in the art as a means for supplying a known current as, for example, in biasing transistor gain stages. While a "current source" may be as simple as a resistor, current mirrors have become increasingly used for several reasons. First, they offer improved circuit performance and more accurate current control than do resistors, and also require less area on an integrated circuit chip. The most conventional and simple circuit for a current mirrors requires high beta (beta means an amplifying coefficient and refers as $\beta$) transistors, or at least transistors having consistent values of $\beta$, in order to approach the desired corelation between output and reference or input current. In IC (integrated circuit) processing, this is, of course, difficult and thus expensive as $\beta$ values tend to have a wide range of values and restriction of the usable range of values makes for a low IC production yield.

FIGS. 1 to 2 show schematic diagrams of typical prior art current mirror circuits. Throughout the drawings, like reference numerals and letters are used to designate like or equivalent elements for the sake of simplicity of explanation.

FIG. 1 shows the proto-type current mirror circuit which has PNP transistors Q1 and Q2 with their base-emitter paths connected in parallel to a power supply line 11 supplied with a power source voltage Vcc therefrom. Transistors Q1 is connected in the diode-fashion by itself and at its collector to an input current source 12. An output current Iout is derived from the collector of transistor Q2.

However, this circuit arrangement has a drawback in that an error of a comparatively large magnitude is provided between an input current Iin supplied by input current source 12 and output current Iout due to the base current of transistors Q1 and Q2. Since there arise some bad influences such as an error between base currents Ib1 and Ib2 of transistors Q1 and Q2, and more the so-called Early effect. A relation between output current Iout and input current Iin is, therefore, given as follows when the influences of the error between base currents Ib1 and Ib2 and the Early effect are considered;

$$Iout = \frac{1}{\left(1 + \frac{1}{\beta}\right) \cdot \frac{1 + \frac{Vce1}{Va}}{1 + \frac{Vce2}{Va}} + \frac{1}{\beta}} \cdot Iin \quad (1)$$

where Vce1 and Vce2 designate the voltage drops across the collector-emitter pathes of respective transistor Q1 and Q2, Va designates the Early voltage of bipolar transistors.

FIG. 2 shows an improved prior art current mirror circuit. This circuit comprises a differential circuit 15 comprised of emitter-coupled NPN transistors Q3 and Q4 in addition to current mirror PNP transistors Q1 and Q2. Transistor Q3 has its collector connected to a power supply source 11 and its base connected to the collector of transistor Q1. On the other hand, transistor Q4 has its collector connected to the bases of transistors Q1 and Q2 and its base connected to a reference voltage source 13 of reference voltage Vref. The emitters of transistors Q3 and Q4 are connected through a current source 14 of current value Ics to a circuit ground GND. Current Ics is set to be higher than the sum of base currents Ib1 and Ib2 of transistors Q1 and Q2, i.e., Ics > Ib1+Ib2. Transistor Q3 is provided for the level shift, and thus potential Vb3 at the base of transistor Q3 is determined by reference voltage Vref. Namely, the circuit of FIG. 2 can be operated from a low supply voltage so long as reference voltage Vref has such a magnitude to render all the transistors conductive.

In the circuit of FIG. 2, both the bases of transistors Q1 and Q2 are kept in almost the same potential. Collector-emitter voltages Vce1 and Vce2 of transistors Q1 and Q2, therefore, balance each other if reference voltage Vref is made equivalent with the collector potential of transistor Q2. Accordingly, the influence of the Early effect in the pair of transistors Q1 and Q2 can be illuminated. And further, the influence of the Early effect in the pair of transistors Q3 and Q4 can be also disregarded since the Early voltage Va(NPN) for NPN ransistors is very large enough to ignore results of culculations Vce3/Va and Vce4/Va. Therefore, a relation between output current Iout and input current Iin in the circuit of FIG. 2 is presented as follows;

$$Iout = \frac{1 + \frac{Ics}{1 + \beta_n}}{1 + \frac{2}{\beta_n \cdot \beta_p}} \cdot Iin \quad (2)$$

where $\beta n$ and $\beta p$ designate current amplification factors of NPN and PNP transistors respectively.

From the above equation (2), it is understood that an influence of the $\beta p$ is very small. On the other hand, current Ics of current source 14 is entered in the equation (2) as an error component. However the term Ics/(1+$\beta$n) can also be ignored since $\beta$n > > $\beta$p and provided that current Ics is set in a prescribed value. Therefore, the circuit of FIG. 2 has been almost prevented from the bad influences from the error between base currents Ib1 and Ib2 of transistors Q1 and Q2 and the Early effect.

However, this circuit arrangement of FIG. 2 still has a drawback that current Ics of current source 14 is always required a relatively large value more than a prescribed value. That is, current Ics of current source 14 must be larger than the sum of base currents Ib1 and Ib2 of transistors Q1 and Q2, i.e., Ics > Ib1+Ib2. In the event of input current Iin from input current source 12 being variable, current Ics is necessary to ensure the sum of the maximum values Ib1(max) and Ib2(max) of base currents Ib1 and Ib2. Therefore, the necessary amount of current Ics is determined as follows, i.e., Ics > 2Iin(max)/$\beta$p, where Iin(max) designates the maximum value of input current Iin. Accordingly, a relative amount of current Ics is compensated in vain when input current Iin is small.

The circuit of FIG. 2 has also another drawback that the influence of the term Ics/(1+$\beta$n) in the equation (2) becomes not ignored for the error between output current Iout and input current Iin when Iin < < Ics. The the circuit of FIG. 2 is still insufficient for the use wherein input current Iin is variable.

SUMMARY OF THE INVENTION

An object of the present invention is to provide a current mirror circuit which is able to operate in following to wide range input currents.

Another object of the present invention is to provide a current mirror circuit which is able to operate with less errors between input and output currents.

A further object of the present invention is to provide a current mirror circuit which is able to operate with less power consumptions.

These and other objects are achieved in the current mirror circuit of the present invention which includes a power supply source, a circuit ground, a reference voltage source, first and second transistors of a first conductivity type, which have their collectors, their bases connected together and their emitters connected to the power supply source, an input current supplying transistor connected in series to the collector-emitter path of the first transistor, an output current deriving circuit connected in series to the collector-emitter path of the second transistor, a third transistor of a second conductivity type complementary to the first conductivity type, which has its collector connected to the power supply source, its base connected to the collector of the first transistor and its emitter, a fourth transistor of the second conductivity type, which has its collector connected to the bases of the first and second transistors, its base connected to the reference voltage source and its emitter connected to the emitter of the third transistor, and a current source transistor connected between the emitter of the third and fourth transistors and the circuit ground, which is connected to the input current supplying transistor so as to be controlled by the input current supplying transistor.

Additional objects, advantages, and features of the present invention will become apparent to persons skilled in the art from a study of the following description and of the accompanying drawings, in which:

DESCRIPTION OF THE PREFERRED EMBODIMENTS

Figure 1:
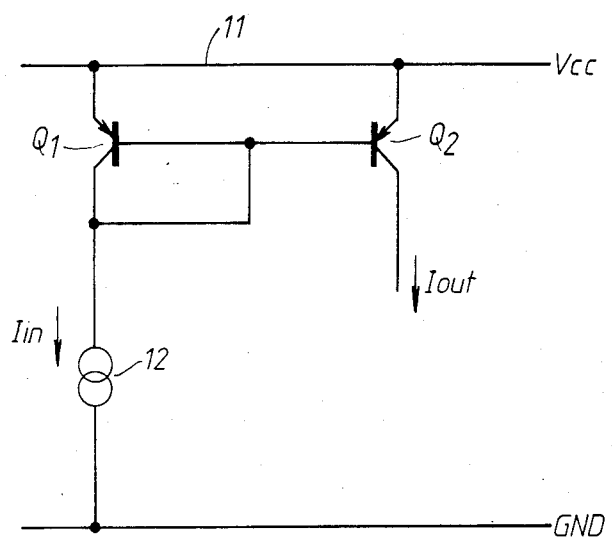
FIG. 1 is a schematic diagram of a simple prior art current mirror circuit.

The present invention will now be described in detail with reference to the accompanying drawings, namely, FIGS. 3 to 5. Throughout the drawings, like reference numerals and letters used in the drawings of the prior art circuits FIGS. 1 and 2 are also used to designate like or equivalent elements for the sake of simplicity of explanation.

Figure 3:
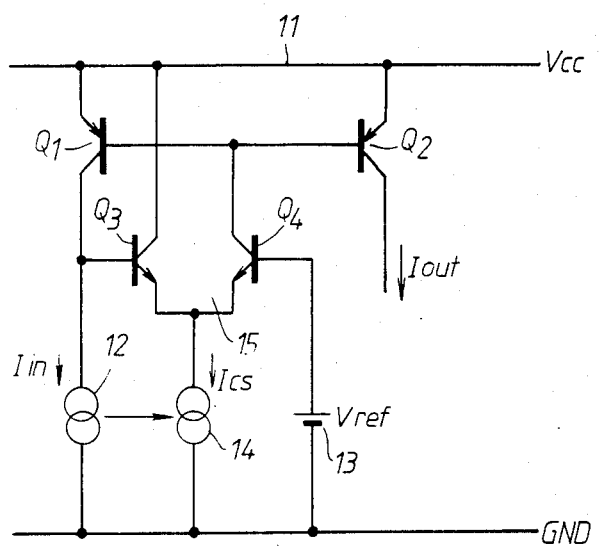
FIG. 3 is a schematic diagram showing an embodiment of the current mirror circuit according to the present invention.

Referring now to FIG. 3, there is shown a current mirror circuit embodying the present invention. Like the well-known circuits, current mirror transistors Q1 and Q2 of PNP type are provided with their emitters connected to a power supply line 11 of supply voltage Vcc and their bases connected together. The collectors of transistors Q1 and Q2 are respectively connected to a current input source 12 for supplying an input current Iin. An output current Iout of the circuit is derived from the collector of transistor Q2. An NPN transistor Q4 is provided for a compensation of the current amplification factor $\beta$ of transistors. This transistor Q4 has its emitter connected to the bases of transistors Q1 and Q2 and its collector connected to a reference voltage source 13 of reference voltage Vref. Another NPN transistor Q3 is provided for level shifting, which has its collector connected to power supply line 11, its emitter connected to the emitter of transistor Q4 and its base connected to the collector of transistor Q1. A current source 14 for providing current Ics is connected between a circuit ground GND and the common emitter connection of transistors Q3 and Q4, i.e., the bases of transistors Q3 and Q4. Current source 14 is related to input current source 12 as symbolized by an arrow in the drawings so that the current Ics varies in proportion to input current Iin.

Figure 2:
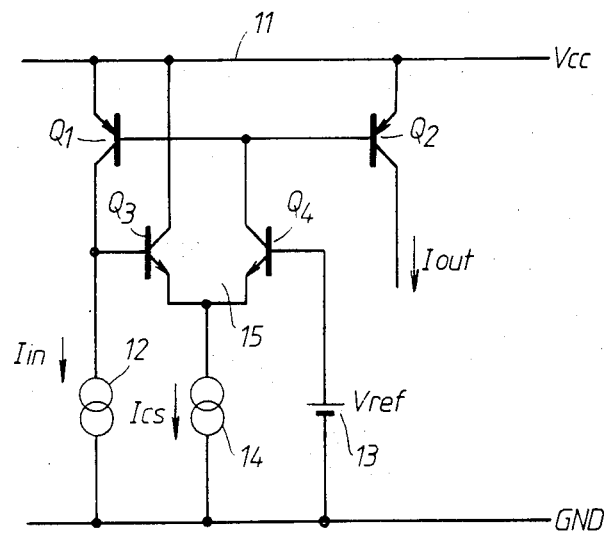
FIG. 2 is a schematic diagram of another prior art current mirror circuit as improved for the circuit of FIG. 1.

In the circuit of FIG. 3, transistors Q1 to Q4 are connected similarly to those in the prior art circuit of FIG. 2 and also operate in the similar manner in the prior art. That is, both the bases of transistors Q1 and Q2 are kept in almost the same potential. Collector-emitter voltages Vce1 and Vce2 of transistors Q1 and Q2 balance each other in providing that reference voltage Vref is made equivalent with the collector potential of transistor Q2. Accordingly, the influences of the Early effect in the respective pairs of transistors Q1, Q2 and Q3, Q4 can be also disregarded.

Therefore, a relation between output current Iout and input current Iin in the circuit of FIG. 3 is also presented by the same equation (2) as the prior art of FIG. 2. However, current Ics in the circuit of FIG. 3 can be varied in proportion to input current Iin. That is, current Ics supplied from current source 14 is automatically controlled by the amount of input current Iin. The current Ics becomes small when input current Iin decreases. Accordingly, current Ics can be prevented from its waste.

In the circuit of FIG. 3, the influence of the term Ics/(1+$\beta$n) in equation (2) is always able to be illumiinated for any value of current Ics because current Ics is kept in sufficiently smaller than the value of input current Iin at that time. Therefore, the error between input current Iin and output current Iout is also able to be ignored so that output current Iout accurately proportional to input current Iin is obtained.

Figure 4:
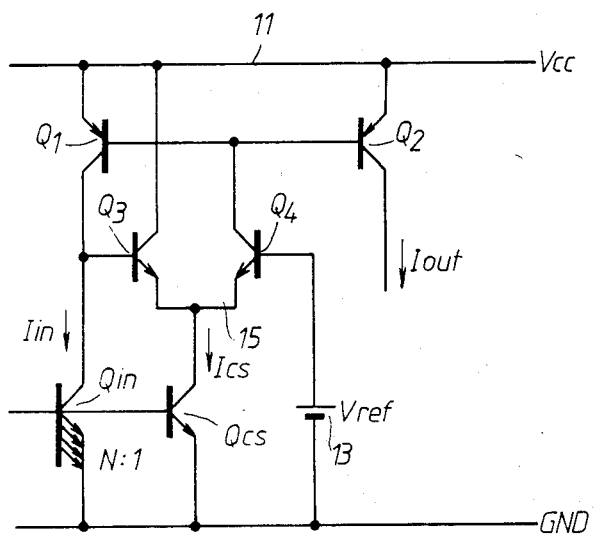
FIG. 4 is a schematic diagram showing a practical circuit arrangement embodying the current mirror circuit of FIG. 3.

Referring now to FIG. 4, there is shown a practical circuit arrangement of the current mirror circuit according to the present invention. In the circuit of FIG. 4, an input current source 12 and a current source 14 are constructed by NPN transistors Qin and Qcs. The bases of respective transistors Qin and Qcs are connected to each other and base-emitter junction areas of both transistors Qin and Qcs are set in a ratio of N:1. While the rest of the circuit is identical with the circuit of FIG. 3.

In the above circuit, a relation between an input current Iin of input current source 12 and a current Ics of current source 14 is always kept in constant as presented as follows; i.e., Iin:Ics=N:1. Therefore, Ics=Iin/N is obtained. Equation (2) is then modified as follows by replacing Iin/N for Ics.

$$I_{out} = \frac{1 + \frac{1}{N(1 + \beta_n)}}{1 + \frac{2}{\beta_n \cdot \beta_p}} \cdot I_{in} \qquad (3)$$

As clearly understood from Equation (3), output current Iout is only proportional to input current Iin but not be influenced by the amount of input current Iin or current Ics. Therefore, the waste of current Ics and the error between output current Iout and input current Iin are prevented.

By the way, current Ics of current source 14, i.e., the collector current of transistor Qcs is required to be larger than the sum of base currents Ib1 and Ib2 of transistors Q1 and Q2; i.e., Ics>Ib1+Ib2 as described before. From the condition, the base-emitter junction area ratio N between transistors Qin and Qcs is restricted as follows; i.e., $N<\beta p/2$. Actually the value of $\beta p$ is scattered in some extent. Providing that a minimum value of the extent is given as $\beta p(min)$, the ratio N is required to be $N<\beta p(min)/2$.

Figure 5:
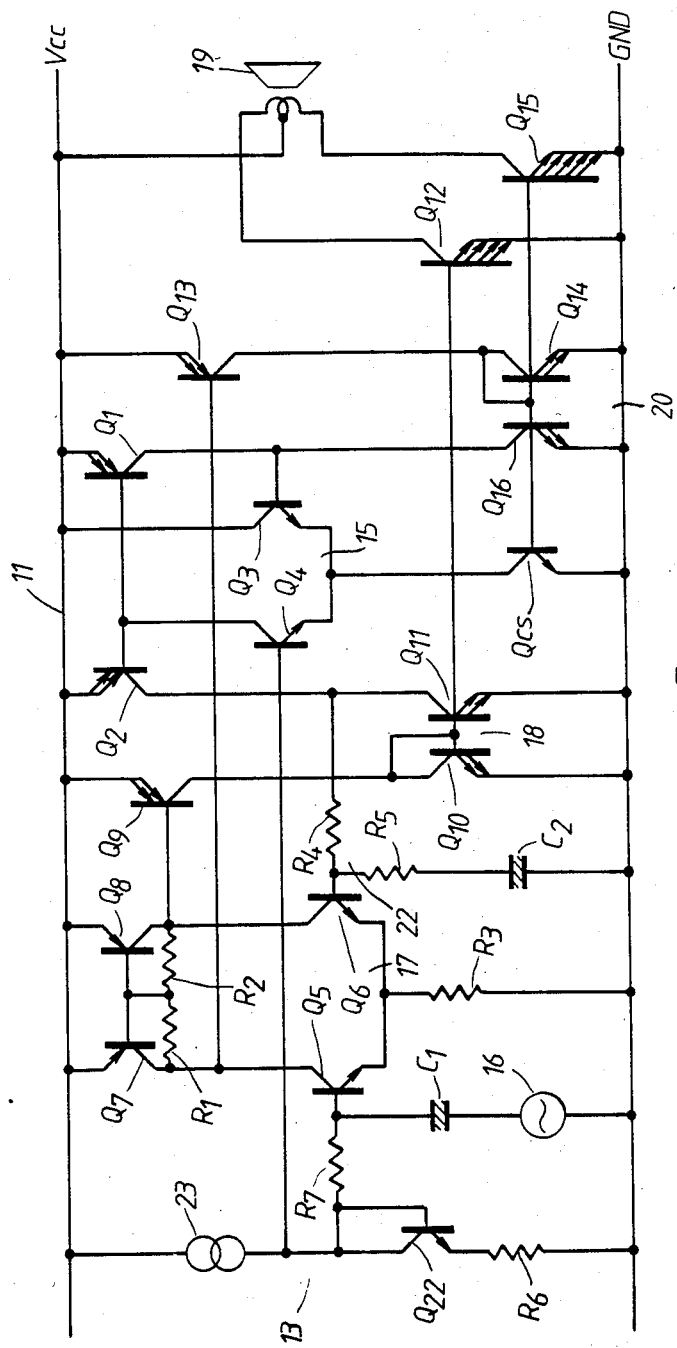
FIG. 5 is a schematic diagram showing a power amplifier provided with the current mirror circuit according to the present invention.

Referring now to FIG. 5, there is shown a schematic diagram of a power amplifier for driving a loudspeaker 19 provided with an embodiment of the current mirror circuit according to the present invention. As shown in FIG. 5, a signal source 16 is connected to a differential circuit 17 through a capacitor C1. Differential circuit 17 is comprised of NPN transistors Q5 and Q6 whose emitters are coupled together and then connected to a circuit ground GND through a resistor R3.

The collectors of transistors Q5 and Q6 are connected to a power supply line 11 through an active load 16. The active load 16 is comprised of PNP transistors Q7 and Q8 and resistors R1 and R2. PNP transistors Q7 and Q8 are parallelly connected between power supply line 11 and NPN transistors Q5 and Q6 of differential circuit 17, and their collectors are coupled together through a series connection of resistors R1 and R2, and further their bases are not only connected together but also connected to the connectoin node of resistors R1 and R2.

The collector of transistor Q6 which is the output side transistor in differential circuit 17 is connected to the base of a PNP transistor Q9, while the collector of transistor Q5 which is the input side transistor in differential circuit 17 is connected to the base of a PNP transistor Q13. Transistors Q9 and Q13 are respectively connected as input current sources to current mirror circuits 18 and 20. Current mirror circuit 18 is comprised of a PNP transistor Q10 which is connected in the diode fashion by itself and connected between power supply line 11 and circuit ground GND through transistor Q9, and an NPN transistor Q11 which is connected between power supply line 11 and circuit ground GND through transistor Q2. Current mirror circuit 20 is comprised of PNP transistor Q14 which is connected in the diode fashion by itself and connected between power supply line 11 and circuit ground GND through transistor Q13, and an NPN transistor Q16 which is connected between power supply line 11 and circuit ground GND through transistor Q1.

Transistors Q1 and Q2 constitute a part of the current mirror circuit according to the present invention together with a differtial circuit 15 comprised of emitter-coupled NPN transistors Q3 and Q4. Transistor Q3 has its collector connected to power supply source 11 and its base connected to the collector of transistor Q1. On the other hand, transistor Q4 has its collector connected to the bases of transistors Q1 and Q2 and its base connected to a reference voltage source 13. The emitters of transistors Q3 and Q4 are connected through an NPN transistor Qcs as a current source 14 for differential circuit 15 to circuit ground GND.

Reference voltage source 13 is comprised of a constant current source 23, an NPN transistor Q22 which is connected in the diode fashion by itself and a resistor R6, which are connected in series between power supply line 11 and circuit ground GND. The collector of transistor Q22 is connected not only to the base of transistor Q4 of differential circuit 15 but also to the base of transistor Q5 of differential circuit 17 through a resistor R7.

The base of transistor Q6 of differential circuit 17 is connected not only to the collector of transistor Q11 of current mirror circuit 18 through a resistor R4 but also to circuit ground GND through a resistor R5 and a capacitor C2 in series. The common coupled bases of transistors Q10 and Q11 of current mirror circuit 18 are connected to one end of the voice coil of of loudspeaker 19 through an NPN transistor Q12, while the common coupled bases of transistors Q14 and Q16 of current mirror circuit 20 are connected to another end of the voice coil of loudspeaker 19 through an NPN transistor Q15. Transistors Q12 and Q15 are respectively connected at their collector-emitter pathes between power supply line 11 and circuit ground GND through loudspeaker 19. Loudspeaker 19 is at a center tap of its voice coil to power supply line 11.

An input signal from signal source 16 is applied to differential circuit 17. One polarity component of the output of differential circuit 17 is derived from the collector of transistor Q6 and then supplied to loudspeaker 19 through transistor Q9, current mirror circuit 18 and transistor Q12. While another polarity component of the output of differential circuit 17 is derived from the collector of transistor Q5 and then supplied to loudspeaker 19 through transistor Q13, current mirror circuit 20 and transistor Q15.

A collector current I16 of transistor Q16 in current mirror circuit 20 operates as an input current Iin for the current mirror circuit comprised of transistors Qin and Q1 through Q4. A collector current of transistor Q2, i.e., an output current Iout of the current mirror circuit is supplied not only to the collector of transistor Q11 but also to differential circuit 17 through a feedback path comprised of resistors R4, R5 and capacitor C2. On the other hand, a reference voltage Vref produced by reference voltage source 13 is applied to the base of transistor Q4 of differential circuit 15 in the current mirror circuit.

What is claimed is:

1. A current mirror circuit comprising:
   a power supply means;
   a circuit ground voltage supply means;
   a reference voltage supplying means;
   first and second transistors of a first conductivity type their bases connected together and their emitters connected to said power supply means;
   an input current supplying means connected in series to the collector-emitter path of said first transistor;
   an output current deriving means connected in series to the collector-emitter path of said second transistor;
   a third transistor of a second conductivity type complementary to the first conductivity type, which has its collector connected to said power supply means, its base connected to the collector of said first transistor and its emitter connected to a current source;

a fourth transistor of the second conductivity type, which has its collector connected to the bases of said first and second transistors, its base connected to said reference voltage supplying means and its emitter connected to the emitter of said third transistor; and wherein the current source is connected between the emitter of said third and fourth transistors and said circuit ground voltage supply means and is directly connected to said input current supplying means so as to be controlled by said input current supplying means.

2. The current mirror circuit according to claim 1 wherein said current source is so controlled by said input current supplying means that a current of said current source varies in proportion to a current of said input currnt supplying means.

3. The current mirror circuit according to claim 2 wherein said input current supplying means and said current source are a fifth and a sixth transistors of the second conductivity type, and their bases are connected together.

4. The current mirror circuit according to claim 3 wherein the base-emitter junction area of said fifth transistor is larger than the base-emitter junction area of said sixth transistor.

5. The current mirror circuit according to claim 4 wherein a ratio between the base-emitter junction areas of said fifth and sixth transistors is set smaller than a half of an amplification factor of the first conductivity type transistors.

* * * * *